United States Patent [19]

Melen

[11] 4,041,519
[45] Aug. 9, 1977

[54] LOW TRANSIENT EFFECT SWITCHING DEVICE AND METHOD

[76] Inventor: Roger D. Melen, 565 Arastradero, No. 304, Palo Alto, Calif. 94306

[21] Appl. No.: 548,407

[22] Filed: Feb. 10, 1975

[51] Int. Cl.$^2$ .................. H01L 27/14; H01L 31/00; H01L 29/78; H01L 27/02
[52] U.S. Cl. .............................. 357/30; 357/23; 357/41; 250/211 J; 29/571; 29/578; 307/304; 307/311
[58] Field of Search .................. 357/23, 30, 32, 45, 357/41; 307/251, 304, 311; 340/166 R; 250/211 J

[56] References Cited

U.S. PATENT DOCUMENTS

| 3,436,623 | 4/1969 | Beer | 357/4 |
| 3,657,614 | 4/1972 | Cricchi | 357/23 |
| 3,845,295 | 10/1974 | Williams et al. | 357/24 |
| 3,849,678 | 11/1974 | Flynn | 357/32 |
| 3,877,058 | 4/1975 | Cricchi | 357/23 |
| 3,906,544 | 9/1975 | Engeler et al. | 357/23 |

OTHER PUBLICATIONS

Hochberg, "FET Gate Structure," IBM Tech. Disclosure Bulletin, vol. 8, (10/65) p. 813.

Primary Examiner—William D. Larkins
Assistant Examiner—Gene M. Munson
Attorney, Agent, or Firm—Paul Hentzel

[57] ABSTRACT

A P-channel MOS double gated transistor is provided with an electrical shield element located between the drain and the second gate. The shield is electrically connected to the first gate and is dc biased by the first gate control voltage at FIRST GATE SELECT. The presence of the first gate control voltage causes all the shield capacitances to charge and causes a depletion region between the shield and the drain. Prior to SECOND GATE SELECT, the electrical transient effects of activating the shield with a dc bias have expired. SECOND GATE SELECT introduces new transients (noise current), noteable charging of the capacitance between the drain and the second gate and formation of the final section of depletion region proximate the second gate completing the P channel. This capacitance is drastically reduced by the intervening shield, and the depletion transient is minimized by the priming depletion region established by the shield voltage.

9 Claims, 7 Drawing Figures

LOW TRANSIENT EFFECT SWITCHING DEVICE AND METHOD

BACKGROUND OF THE INVENTION

This invention relates to MOS switching devices, and particularly to such devices having a shield gate for reducing switching noise.

Heretofore, photosensitive image arrays were switched through access transistors associated with each photosensitive element as shown in FIG. 1 (Prior Art). The prior art doublegated access switch 10 has two separate switching structures in series: a P-channel row, transistor 12R with a source 14R, a drain 16R, a row select gate 18R; and a P-channel column transistor 12C with a source 14C, a drain 16C, and a column select gate 18C. A photo diode 20 from the array is connected to row source 14R of each access switch. Diode 20 is charged by a reverse bias voltage and discharges, accumulating holes in response to incident radiation 22. The amount of discharge or hole accumulation on each diode 20 during the exposure period is a function of the intensity of light at that element of the image array. Access switches 10 are sequentially selected by a scanning device (not shown) and the accumulated charge flows through simultaneously activated row transistor 12R and column transistor 12C to form a read out current at common output 24 connected to each column drain 16C. The readout time per array element is short, about one micro second, and the accumulated charge is small, about two pico coulombs (one picofarad diode capacitance at two volts). The readout time and readout charge are sufficiently small that transient effects encountered in turning on access device 10, especially column transistor 12C, are significant. Row transistor 12R is selected first and has attained a steady state, dc bias condition when column transistor 12C is turned on. The start-up transients in row transistor 12R have expired prior to the discharge of diode 20 through access switch 10. The start-up transients of column transistor 12C however, occur simultaneously with the readout current and significantly affect the total current at output 24. This transient noise current has two primary factors: a charging current generated by the gate 18C to drain 16C capacitance which charges immediately after turnon, and a depletion current generated as the drain depletion region 26 is formed in column transistor 12C. A typical gate-to-drain capacitance of transistor 12C is about 0.03 picofarads, causing a signal-to-noise ratio of about 30. The low light level light end of the dynamic range is severely limited by this capacitance.

In addition the S/N ratio varies drastically between access switches 10 → because the Miller capacitances are not uniform. This capacitance is inversely proportional to the gate 18C-to-drain 16C spacing. The gate-drain overlap region 28 provides the majority of the capacitance because along overlap 24 the capacitance spacing is the closest, limited only by the thickness of silicon oxide 30 which is typically 0.1 microns. Overlap 28 is kept to a minimum to reduce the Miller capacitance and is only tolerated because a nominal amount of overlap is required to properly locate depletion region 26. Any slight lateral shift of gate 18C relative to drain 16C between access devices causes great changes in the overlap portion of the capacitance. For instance: a one micron overlap has a mean spacing of 0.1 micron and a capacitance of 0.03 picofarads; a zero micron overlap has a mean spacing of about 1.0 microns causing a capacitance drop of 90% from the one micron overlap capacitance; and a one micron underlap has a mean spacing of about 2.0 microns causing a capacitance drop of 95% from the one micron overlap capacitance. Small misalinement errors in overlap 28 produce great changes in gate-to-drain capacitance. Mask alignment error in manufacturing access switches 10 is typically about three microns. Self-alignment techniques reduce this error to about one micron. However, self-alignment techniques involve diffusion temperatures in excess of 1000° C and are not applicable to devices requiring aluminum which evaporates at 600° C. Even with self-alignment techniques the one micron error causes the S/N ratio to vary by a factor of 10 to 1 between access switches 10.

SUMMARY OF THE INVENTION

It is therefore a object of this invention to provide:
a device having lower switching noise;
a switching device having less transient switching current due to interelement capacitance and depletion region establishment;
a switching device in which interelement capacitance is less dependent on interelement spacing and mask alinement;
a switching device in which interelement spacing is not critical and which does not require high temperature self-alignment techniques;
an image sensor in which the noise associated with each element is lower and more uniform;
an image sensor having a higher and more uniform S/N ratio between sensor elements;
an image sensor device having a greater dynamic range;
an image sensor operable at lower light levels and having improved spectral response characteristics especially in the blue region.

BRIEF DESCRIPTION OF THE DRAWINGS

The foregoing objects and other objects and advantages of the present switching transistor, and the operation of the shield element will become apparent from the following detailed description and the accompanying drawing in which.

DETAILED DESCRIPTION OF THE PREFERRED EMBODIMENT

Figure 1:
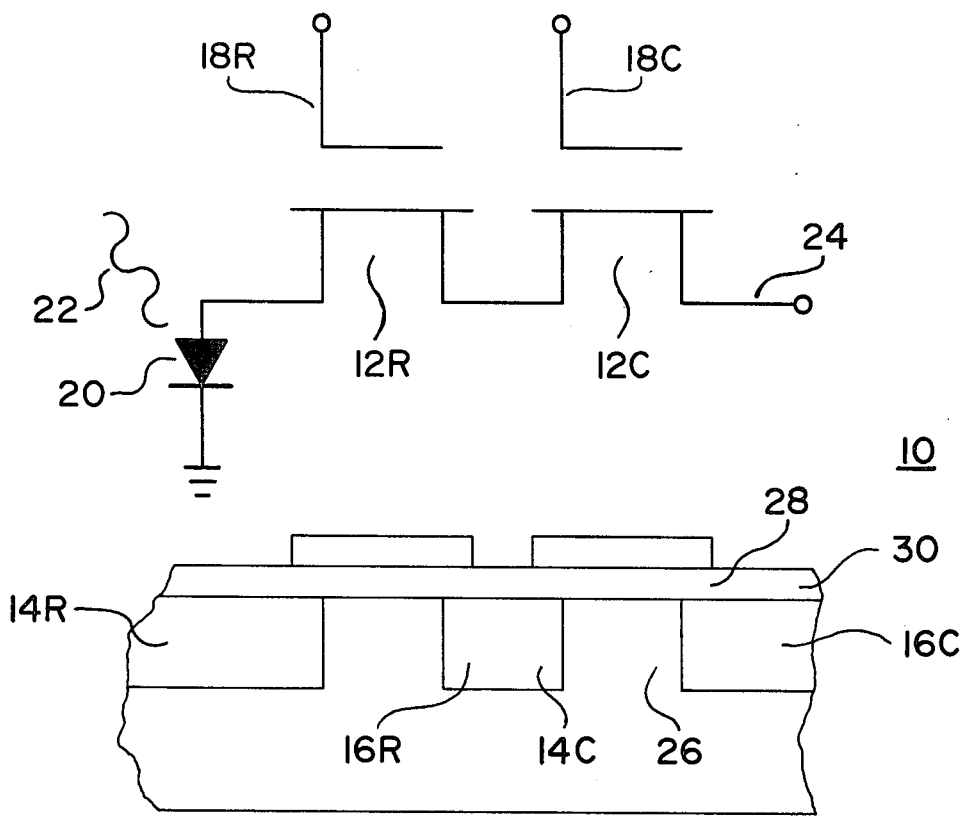
FIG. 1 is a prior art access switch in sectional and schematic view having a row transistor and a column transistor.
Figure 2:
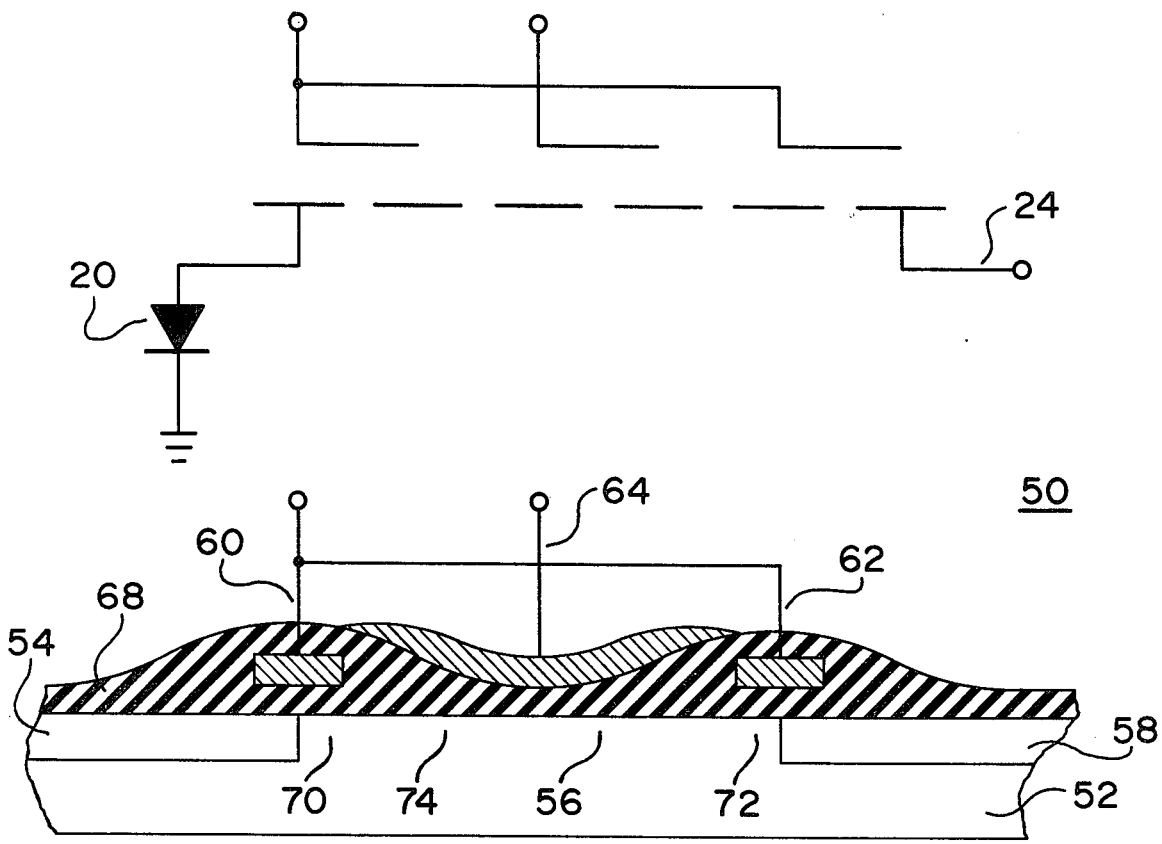
FIG. 2 is the present access switch in sectional and schematic view having one double gated transistor.

Referring to FIG. 2 there is shown a doublegated single access transistor 50 having the following elements: an N substrate 52, a P source 54, an N channel 56, a P drain 58, a buried row gate 60 adjacent to source 54, a buried shield 62 adjacent to drain 58, and surface column gate 64 between the two buried elements. Shield 62 is electrically connected to row gate 60 and is activated at ROW SELECT by the same voltage as row gate 60. The ends of row gate 60 overlap slightly with source 54 and column gate 64 to establish a field induced inversion region 70 on the source side of channel 56. Shield 62 overlaps slightly with drain 58 and column gate 64 to establish a corresponding field induced depletion region 72. In the time period after ROW SELECT but prior to COLUMN SELECT field induced regions 70 and 72 are formed in channel 56 extending toward one another but not touching; and the capacitances associated with row gate 60 and shield 62 become fully charged. The ROW SELECT transients expire and the source portion and drain portion of transistor 50 exhibit a steady state dc bias prior to COLUMN SELECT. At COLUMN SELECT gate 64 is activated forming a center depletion region 74 which connects source inversion region 70 with drain depletion region 72 establishing electrical communication between source 54 and drain 58 permitting minority carriers (holes) accumulated in diode 20 to pass through transistor 50 to common output 24. This shielded double gated configuration of transistor 50 may be referred to as a double cascade image sensor, or DCI device 50. DCI device 50 is described in the "1974 IEEE International Solid-State Circuits Conference", Digest of Technical Papers page 32, 13 February 1974, 11:45 AM.

Figure 3:
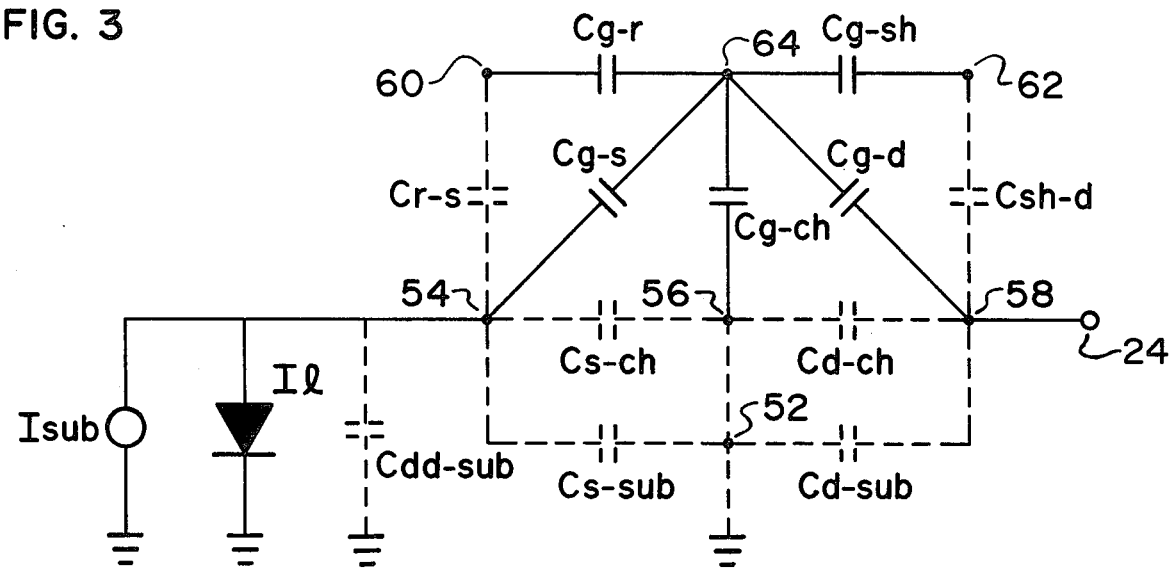
FIG. 3 is an equivalent circuit of the present access switch of FIG. 2 showing some of the interelement capacitances.

FIG. 3 shows an equivalent circuit of an image sensor element employing access transistor 50 showing the major interelement capacitances. The capacitances shown in phantom become fully charged upon ROW SELECT and do not contribute to COLUMN SELECT noise current.

C(dd-sub) and I(sub) represent junction capacitance and leakage current between photodiode 20 substrate 52. I1 is current generated by light incident on photodiode 20.

C(s-ch) represents source 54 to middle of channel 56 capacitance and C(d-ch) represents drain 58 to middle of channel 56 capacitance. C(s-ch) and C(d-ch) is given by $$C(s-ch) = C(d-ch) = \frac{E_o E_{si} WX}{L/2}$$

where
- Eo = dielectric constant of vacuum
- Esi = relative dielectric constant of silicon (12)
- L = channel 56 length
- W = channel 56 width
- X = depletion layer length of silicon C(g-s) represents gate 64-to-source 54 overlapping capacitance, and C(g-d) represents gate 64 to drain 50 overlapping capacitance. Assuming a symmetrical construction, first order approximations are given by $$C(g-s) = C(g-d) = \frac{L_x W E_o E_{ox}}{T_{ox}}$$

where
- Lx = overlapping distance between gate source 64 and source 54 or between gate 64 and drain 58
- W = channel 56 width
- Eox = dielectric constant of gate oxide 68
- Tox = thickness of gate oxide 68

The value of Lx is typically 5 microns in the conventional access device 10; but is zero in shielded access transistor 50 due to the electrostatic shielding by row gate 60 and shield 62. Thus C(g-s) and C(g-d) are negligible in double gated device 50.

Similarly, C(g-ch), gate 64-to-channel 56 capacitance, is given by $$C(g-ch) = \frac{L W E_o E_{ox}}{T_{ox}}$$

where L represents the distance between source 54 and drain 58. The sum of the two L's in conventional double transistor switch 10 is slightly smaller than the single L of double gated DCI transistor 50, so that the gate-to-channel capacitance in the conventional switch may be slightly smaller. But this difference is negligible compared with the above difference in C(g-s) and C(g-d).

The presence of drain depletion region 72 produces several surprising effects. First, the row switching voltage may be designed to establish field induced regions 70 and 72 just short of touching. Thus center depletion region 74 may be nominal, minimizing the depletion current generated at COLUMN SELECT which is one factor of the transient noise current. Secondly, drain 58 may be positioned laterally from column gate 64 in a substantially underlapped relationship reducing Lx to zero as discussed in connection with FIG. 3. The capacitance C(g-d) approximates zero practically eliminating the transient charge current, another factor of noise current. C(g-d) is further minimized by the physical intervention of shield 62 which physically increases the distance between gate 64 and drain 58 and forces the electrostatic lines of force between gate 64 and drain 58 into a curved path. Thirdly, the relative positions of the elements of transistor 50 are no longer critically affect the capacitance C(g-d). Each capacitance associated with row gate 60 and shield 62 is dependent on the spacing, especially overlap capacitance C(r-s) and C(sh-d). However, these two capacitances are fully charged prior to COLUMN SELECT and cannot contribute to noise current during readout. The capacitances associated with column gate 64 also vary with spacing, especially the overlap capacitances C(g-r) and C(g-sh). Column gate 64 capacitances C(g-r), C(g-s), and C(g-sh) are uncharged at COLUMN SELECT and therefore generate a transient charging current during readout. However, this charging current does not flow through output circuit 24 because row gate 60, substrate 52, and shield 62 are at fixed potential-ac ground. These charging currents cannot add to the noise current. Only column gate 64 capacitance C(g-d) is both uncharged at COLUMN SELECT and charges through load 24 forming noise current during readout. C(g-d) is not an overlap capacitance, however, and remains relatively constant with each switch 50 throughout the photosensitive array. Hence, the charging current for C(g-d) is not only small but is generally uniform and may easily be accommodated by appropriate calibration techniques.

Shield 62 is preferably connected to row gate 60 as shown in FIG. 2 which minimizes the number of leads to transistor 50 and allows ROW SELECT to perform two functions — activating row gate 60 and activating shield 62. If desired, shield 62 may be independently connected and activated separately from row gate 60, or even continuously activated. Separate activation of shield 62 permits optimizing the activation voltage and timing for particular applications.

Figure 4:
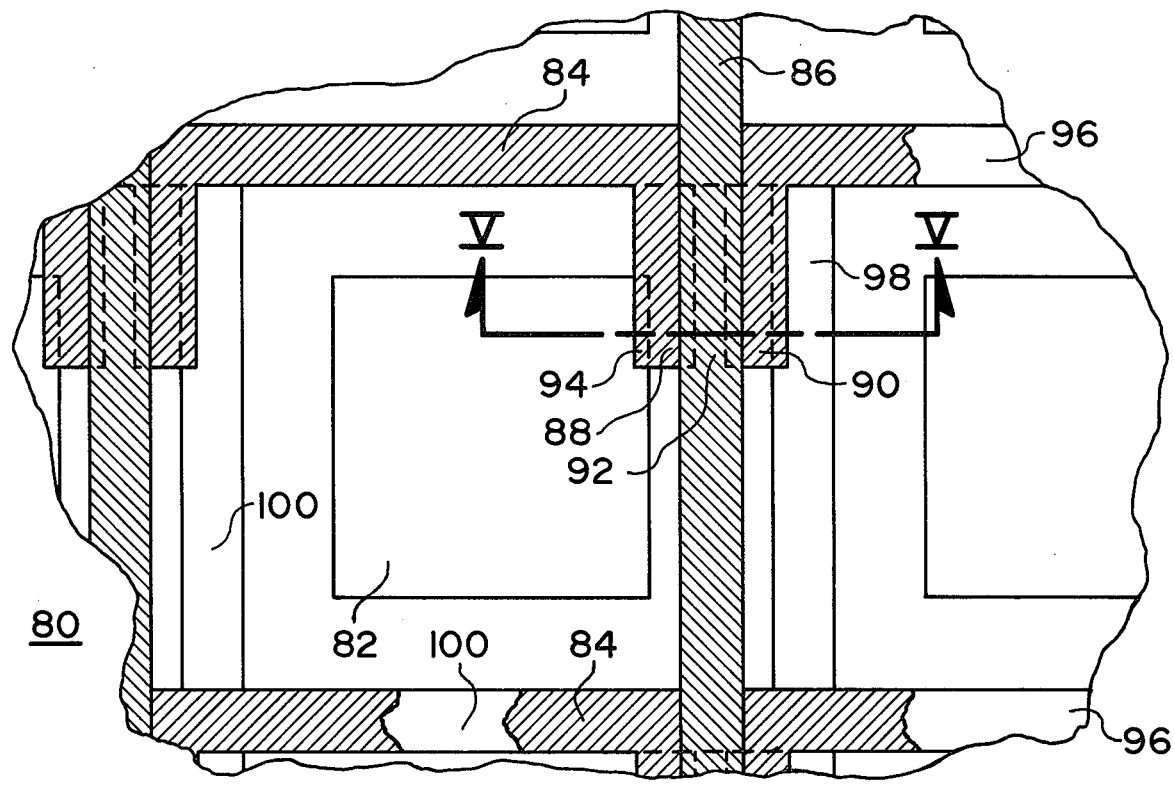
FIG. 4 is a top fragmentary view of one sensor cell in an imaging device showing a switching transistor with a peripheral bloom prevention channel.
Figure 5:
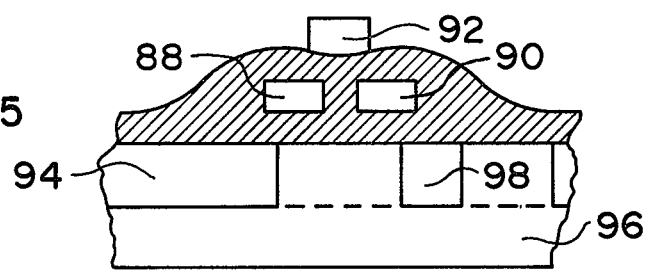
FIG. 5 is the transistor of FIG. 4 taken in section along lines V—V.

FIG. 4 shows a single image DCI cell 80 of a two dimensional matrix of thin P photodiodes 82 arranged in regular rows and columns. Each cell 80 may be randomly accessed through a conductive grid formed by ROW SELECT lead 84 and COLUMN SELECT lead 86. Row lead 84 connects to a row gate 88 and a shield 90 extending therefrom next to each photodiode 82. Column lead 86 is positioned over row lead 84 and forms each select gate 92 due to this position without conductive extention (see side view FIG. 5). Each P source 94 is formed by the edge portion of diode 82 overlapping row gate 88. Common P output channel 96 extends under row lead 84 and each P drain 98 extends therefrom suitably overlapped with shield 90. P drains 98 and P output channels 96 may be interconnected by a bloom prevention P grid 100 extending between diodes 82 for prevent charge spillover from a highly charged intensely illuminated diode into an adjacent diode. Bloom prevention grid 100 may be N type if desired, in which case the N grid must be separately formed from P drains and P output channel 96. Preferrably, output channel 96 is shielded from select lead 86 by row lead 84 extending thereunder to prevent capacitive transients from affecting the readout current in channel 96. Further, if desired a video output amplifier may be provided on the same chip as cell 80 shielded under row lead 84.

Figure 6:
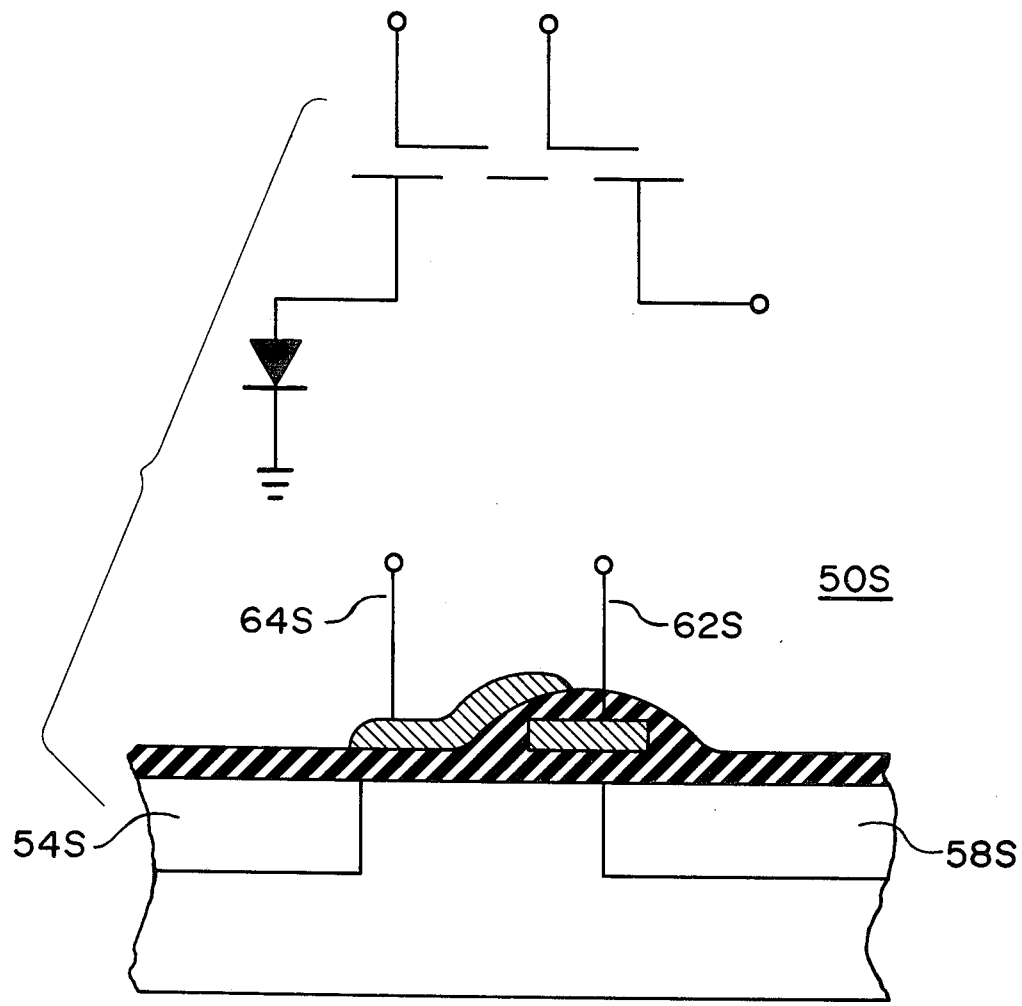
FIG. 6 is an embodiment of the present access transistor having a shield which also functions as the first activated gate.

FIG. 6 shows a single cascode image (SCI) transistor 50S in which row gate 60 has been eliminated and shield 62S has the double function of shielding drain 58S from column gate 64S and row gating SCI transistor 50S. Device 50S is more compact than DCI device 50, and may have a faster rise time because channel 56S is shorter.

Figure 7:
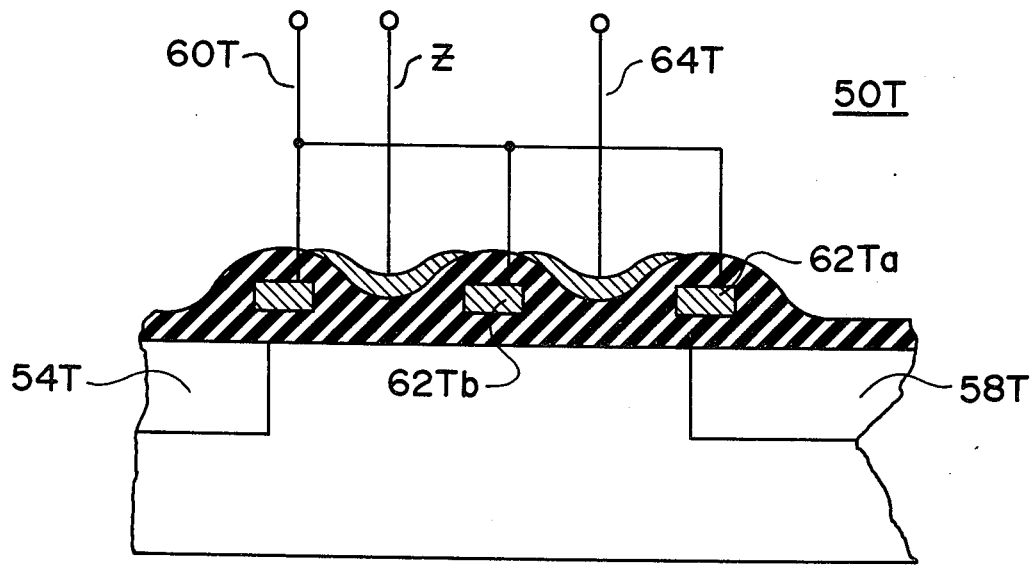
FIG. 7 is an embodiment of the present access transistor having three control gates and two shields.

FIG. 7 shows a triple cascode image (TCI) transistor 50T with row gate 60T, column gate 64T and Z gate therebetween, and two shields 62T$a$ and 62T$b$ provided between the gates. Shield 62T$b$ is provided for fabrication convenience to avoid the multistep procedure required to form overlap between gate 64T and Z gate.

FABRICATION OF TRANSISTOR 52

Transistor 52 may be made as follows:

N type bulk silicon wafer with a <100> material orientation and a resistivity of 3 to 5 ohm cm is preferred for substrate 52. The <100> orientation minimizes Qss and hence the threshold voltage. The 3 to 5 ohm cm resistivity is high enough that low threshold devices can be built with reasonable junction breakdowns and yet low enough that high field thresholds are achieved.

The wafer is initially oxidized at 1200° C with a 5-2-0-5 minute cycle in dry $O_2$- wet $O_2$- dry $O_2$ atmosphere. The resulting oxide is 0.6 microns thick and will serve as the mask for the P source and drain diffusion.

A first photolithographic process defines the source 54 and drain 58 areas where P type diffusions are desired.

These areas are then chemically etched of the oxide defining the desired pattern in the oxide. Kodak Microneg photoresist used to protect the remainder of the oxide during the etching. The photoresist is also placed on the backside of the wafer, to retain the back oxide, which will prevent P diffusion into the back side.

Predeposition for 45 minutes at 1000° C exposing the etched areas of the silicon to boron from a diborane source with a concentration sufficient to reach the solid solubility limit of boron in silicon.

The wafer is then dip-etched in dilute HF to remove the borosilicate glass from the surface.

A 5-90-5 minute drive-in cycle is performed at 1100° C to grow sufficient oxide over the P regions to mask against phosphorus diffusion.

N diffusion to the backside by a phosphorous predeposition for 30 min. at 1075° C, with $POCl_3$ as the dopant source. The dopant concentration is sufficient to reach the solid solubility of phosporous in silicon. The diffusion provides ohmic contacts between the N type substrate and the die, as well as performing the gettering of the transistor junctions.

A dip etch in dilute HF is used to remove the phosphorous glass from the wafer.

Thick field oxide is grown over the entire wafer by a long thermal oxidation at 1100° C using 5-320-5 min in dry $O_2$ - wet $O_2$ - dry $O_2$ cycle. The oxide thickness is about 1.5 microns. The maximization of THF (threshold voltage of parasitic thick oxide devices in the circuit over Vth (normal thin oxide device threshold) provides a wide range of power supply voltages for proper circuit operation. The ratio is maximized by using thin gate oxides and thick field oxides. This oxidation also derives in P junctions of the transistors to the desired 5.5 microns depth.

A second photolithographic operation defines the area for row gate 60 and shield 62. Contact holes for the aluminum-silicon contact may also be opened during this etch through the thick field oxide.

Polysilicon oxide for row gate 60 and shield 62 is then grown at 1200° C in dry $O_2$ for 20 min., or in TCE $O_2$ for 13 min.: resulting in an oxide thickness of about 1,000A A third photolithographic operation defines the contacts between P and polysilicon regions.

A polycrystalline silicon layer is deposited uniformly on the surface.

The polycrystalline layer is then doped heavily with P type in a boron diffusion furnace. The boron must dope the polycrystalline silicon layer heavily enough to produce a low resistivity layer without penetrating the oxide. The masking effectiveness depends on many factors, for example, the kind of impurity, the impurity concentration in the ambient, the surface impurity concentration, the oxide thickness, the diffusion temperature, atmosphere, and time. (See S. Horiuchi and R. Blanchard, "The Masking of Silicon Dioxide Against High Concentrations of Boron," Stanford Electronics Laboratories.)

The excess polycrystalline silicon is then removed through standard photolithography and etching techniques.

The upper layer of oxide is chemically deposited on the surface of the structure after the polycrystalline silicon has been delineated.

Contact holes are then etched through $SiO_2$ layers where necessary to contact the output circuitry.

Aluminum contacts are evaporated on the surface of the wafer using pure aluminum and a Ta filament to minimize sodium contamination of the wafers.

A final photolithographic operation defines the aluminum lines on the wafer.

The completed devices are then functionally tested at the wafer level, and scribed and bonded preferably by thermally-cured gold epoxy. Electrical connections between the array and the flat package are preferably made with a ball bonder, using 1 mil annealed gold wire.

A condensed version of the above fabrication is shown in the following Table 1.

Table 1

| | Processing Schedule | | | |
|---|---|---|---|---|
| Step No. | Procedure | Mask No. | Temperature | Time |
| 1 | Preoxidation Cleaning | — | | |
| 2 | First Oxidation | | 1200° C | 5-30-5 min. |
| 3 | P-pattern Photolithography | 1 | | |
| 4 | P+ Diffusion | | | |
| | (a) Diborane Predeposition | | 1000° C | 45 min. |
| | (b) Drive-in | | 1100° C | 90 min. |
| 5 | N+ Diffusion to Backside | | 1075° C | 60 min. |
| | (a) Photolithography to remove Back Oxide | | | |
| | (b) POCl₃ Diffusion | | 1075° C | 60 min. |
| 6 | Field Oxide Growth | | 1100° C | 5-320-5 min. |
| 7 | Gate and Contact Holes Photolithography | 2 | | |
| 8 | Gate Oxidation | | 1200° C | 20 min. (or 13 min.) in TCE-O₂) |
| 9 | P+ - Polysilicon Contact Photolithography | 3 | | |
| 10 | Polysilicon Deposition | | 950° C | (Nitrox) |
| 11 | Polysilicon Doping (Diborane Diffusion) | | 900° C | 30 min. |
| 12 | Oxide Growth for Polysilicon Etch Mask | | 950° C | 30 min. |
| 13 | Silicon Gate Photolithography | 4 | | |
| 14 | Second Layer Oxide Deposition | | 500° C | (Silox) |
| 15 | Contact Holes Photolithography | 5 | | |
| 16 | Metalization | | | |
| 17 | Metal Photolithography | 6 | | |
| 18 | Testing, Dicing, Packaging | | | |

The above fabrication technique is designed to minimize:
 a. the power consumption (the threshhold voltage)
 b. the immobile charge and mobile charge densities at the Si-SiO₂ interface
 c. the junction leakage currents
 d. the device instabilities both over time and at elevated temperatures Power consumption is an important consideration in a battery powered device. Very low junction leakage currents determine the minimum light levels that the array can reliably detect. Low interface states are preferred to improve the device characteristics and reliability High quality reliable gate oxides may be grown via a new oxidation method called "trichloroethylene-oxidation" has been developed. (See M. Chen and J. W. Hile, "Oxide Charge Reduction by Chemical Gettering with Trichloroethylene During Thermal Oxidation of Silicon," J. of Electrochemical Society, 119, pp. 223–225, Feb. 1972 and G. Diclerck, T. Hattori and G. A. May, submitted to J. Electrochem. Soc.) This technique provides good stability, low surface state densities (a few $10^9 ev^{-1} cm^{-2}$), low noise and low threshold voltage. Junction leakage current due to metallic ions in the completed junction in the silicon can also be significantly reduced.

Five conventional masking steps (P+, gate, poly Si, contact and metal) are required in the standard polysilicon gate MOS technology. One additional mask is required in the above technique to make connections between the P region and Poly Si. In the standard process, connection is made by intermediation of aluminum. In the above process, aluminum may be used as a shield which covers the common readout line and other chip outputs. Instead of poly Si - P+ mask, an additional aluminum mask can be used.

It will be apparent to one skilled in the art that the objects of this invention have been accomplished by providing a previous N activated electric shield gate 62 between output element 58 of transistor 50 and the last gate 64 to be activated for minimizing the Miller capacitance. Field induced depletion region 72 is established by shield 62, which connects with depletion region 74, later established by select gate 64, to turn on transistor 50. Electrical transients associated with shield 62 activation have expired leaving shield 62 in a dc biased steady state condition at the time the last gate 64 is activated. The switching noise is lowered because the only transients present at turn on are from activation of select gate 64 which is shielded from output 24. The lower switching noise permits operation of the image sensor at lower readout currents (low light levels) extending the lower end of the dynamic range. The reduced Miller capacitance is not of the overlap type and is relatively insensitive to mask alignment and electrode spacing within transistor 50.

Clearly various changes may be made embodiments shown without departing from the present inventive concept. For example, transistor 50 may be an N-channel or NPN device in which electrons from a forward biased photodiode are the minority carriers. Because electrons are more mobile, such an NPN device is faster with some sacrifice in charge storage capability. It is preferred that drain 58 be dc biased more negatively than shield 62 causing saturation operation to remove residual holes and reduce the Miller capacitance even further. However, saturation is not essential, and depletion region may have residual holes which reduce the effective spacing between drain 58 and gate 64. A photodiode is shown as the imaging element; however, other energy responsive devices may be employed in other applications such as thermal pressure sensitive devices.

I claim as my invention:

1. An array image sensor responsive to sequentially applied control signals for converting an incident energy pattern into pulses electrical output energy substantially free of switching noise, comprising:
   an array of reversed biased energy responsive diodes which receive the incident pattern and accumulate electrical charge in response thereto;
   output means for outputting the pulses electrical output energy;
   a plurality of MOS transistor switching devices, one associated with each diode of the array, each switching device serially connected between the associated diode of the array and the output means, each switching device having:
   a substrate means with a source electrode means and drain electrode means formed in spaced relationship therein, the source electrode means connected to the associated diode and the drain electrode means connected to the output means;
   a first and second control gate means and an electric shield gate means formed over the substrate means in spaced relationship between the electrode means, the gate means being activated by the control signals for establishing electrical continuity within the substrate means between the electrode means;
   an insulative means formed between the electrode means and the gate means;
   the first control gate means positioned proximate the source electrode means between the source electrode means and the second control gate means for reducing the electrical capacitance from the second control gate means to the source electrode means, and being activated by control signals prior to activation of the second control gate means for charging the electrical capacitance from the first control gate means to source electrode means, and for establishing a field induced inversion region in conjunction with the accumulated charge within the substrate means proximate the source electrode means and the first control gate means;
   the shield gate means positioned proximate the drain electrode means between the drain electrode means and the second control means for reducing the electrical capacitance from the second control gate means to the drain electrode means, and being activated by the control signals prior to activation of the second control gate means for charging the electrical capacitance from the shield gate means to the drain electrode means, and for establishing a field induced depletion region within the substrate means proximate the drain electrode means and the shield gate means;
   the second control gate means positioned between the first control gate means and the shield gate means and being activated by control signals subsequent to the first control gate means and the shield gate means for establishing a field induced region within the substrate proximate the second control gate means which connects the depletion region proximate the drain electrode means with the inversion region proximate the source electrode means to provide temporary electrical continuity between the electrode means permitting the accumulated charge to flow from the diode through the switching device to the output means forming a pulse of electrical output energy with a minimum of switching noise;
   whereby the accumulated electrical charge of a particular diode of the array is selectively discharged to the output means by the first and second control gate means of the associated switching device being activated by the control signals.

2. The image sensor of claim 1, wherein the shield gate means overlaps with the drain electrode means and with the second control gate means.

3. The image sensor of claim 2 wherein the first control gate means overlaps with the source electrode means and the second control gate means.

4. The image sensor of claim 3, wherein:
   the array of energy responsive diodes is a two dimensional matrix of photodiodes;
   the source electrode means of the switching device associated with each photodiode of the matrix is formed by an edge portion of that photodiode; and
   the switching devices are sequentially activated one at a time by the control signals to provide a sequence of output pulses corresponding to the incident energy pattern.

5. The image sensor of claim 4, wherein each transistor switching device is a PNP device, and each photodiode is reversed biased and accumulates minority carriers in response to the incident energy which minority carriers flow through the associated switching device and form the output electrical energy when that switching device is activated.

6. The image sensor of claim 4, wherein the switching device is a PNP transistor, and the sensor further comprises a P conductive channel extending peripherally around each photodiode for preventing image blooming.

7. The image sensor of claim 6, wherein the output means and the drain electrode means form a portion of the peripheral channel.

8. The image sensor of claim 1, wherein the shield gate means is electrically connected to the first control gate means and is activated simultaneously therewith.

9. The image sensor of claim 1 wherein the second gate means has a downwardly extending center portion which extends between the first control gate means and the shield gate means in closer relationship to the electrode means.

* * * * *